(12) United States Patent
Cheng et al.

(10) Patent No.: US 11,825,694 B2
(45) Date of Patent: Nov. 21, 2023

(54) ARRAY SUBSTRATE COMPRISING LIGHT SHIELDING PORTION AND METHOD FOR MANUFACTURING THE SAME

(71) Applicant: BOE TECHNOLOGY GROUP CO., LTD., Beijing (CN)

(72) Inventors: Hongfei Cheng, Beijing (CN); Yuxin Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 1025 days.

(21) Appl. No.: 16/339,499

(22) PCT Filed: Sep. 14, 2018

(86) PCT No.: PCT/CN2018/105723
§ 371 (c)(1),
(2) Date: Apr. 4, 2019

(87) PCT Pub. No.: WO2019/114347
PCT Pub. Date: Jun. 20, 2019

(65) Prior Publication Data
US 2021/0367019 A1 Nov. 25, 2021

(30) Foreign Application Priority Data
Dec. 15, 2017 (CN) .......................... 201711346849.4

(51) Int. Cl.
*H01L 27/32* (2006.01)
*H10K 59/121* (2023.01)
(Continued)

(52) U.S. Cl.
CPC ....... *H10K 59/1213* (2023.02); *H10K 59/124* (2023.02); *H10K 59/126* (2023.02); *H10K 71/00* (2023.02)

(58) Field of Classification Search
CPC ............. H01L 27/3262; H01L 27/3258; H01L 27/3272; H01L 51/56; H01L 27/3246; H01L 27/3276
See application file for complete search history.

(56) References Cited

U.S. PATENT DOCUMENTS

2002/0000561 A1* 1/2002 Yamagata ........... H01L 51/5262
257/81
2002/0050795 A1 5/2002 Imura
(Continued)

FOREIGN PATENT DOCUMENTS

CN 1893096 A 1/2007
CN 102082166 A 6/2011
(Continued)

OTHER PUBLICATIONS

PCT International Search Report, Application No. PCT/CN2018/105723, dated Nov. 23, 2018, 6 pages: with English translation.
(Continued)

*Primary Examiner* — Nilufa Rahim
(74) *Attorney, Agent, or Firm* — Armstrong Teasdale LLP

(57) ABSTRACT

The present disclosure relates to an array substrate and a method for manufacturing the same. The array substrate includes a substrate, a thin film transistor located on the substrate, a light emitting device located on the substrate and spaced apart from the thin film transistor in a direction parallel to a surface of the substrate, and a light shielding portion located between the thin film transistor and the light emitting device for shielding a light from the light emitting device. The light shielding portion surrounds the light emitting layer.

12 Claims, 12 Drawing Sheets

(51) Int. Cl.
*H10K 59/124* (2023.01)
*H10K 59/126* (2023.01)
*H10K 71/00* (2023.01)

(56) References Cited

U.S. PATENT DOCUMENTS

| | | | |
|---|---|---|---|
| 2004/0195961 A1* | 10/2004 | Lin | H01L 27/3248 313/504 |
| 2006/0273715 A1* | 12/2006 | Yang | H05B 33/10 313/504 |
| 2007/0159565 A1 | 7/2007 | Segawa et al. | |
| 2011/0234087 A1* | 9/2011 | Takahashi | H01L 51/5281 313/498 |
| 2012/0298984 A1* | 11/2012 | Park | H01L 27/1225 438/34 |
| 2013/0200379 A1* | 8/2013 | You | H01L 27/1255 257/E21.409 |
| 2014/0038332 A1* | 2/2014 | Park | H01L 27/1288 438/34 |
| 2014/0061607 A1* | 3/2014 | You | H01L 27/3244 438/34 |
| 2017/0125499 A1* | 5/2017 | Kwon | H01L 29/24 |
| 2017/0301743 A1* | 10/2017 | Yang | H01L 27/3262 |

FOREIGN PATENT DOCUMENTS

| | | |
|---|---|---|
| CN | 102386204 A | 3/2012 |
| CN | 103943626 A | 7/2014 |
| CN | 102082166 B | 7/2015 |
| CN | 105304671 A | 2/2016 |
| CN | 106298856 A | 1/2017 |
| CN | 107293554 A | 10/2017 |
| CN | 107968113 A | 4/2018 |

OTHER PUBLICATIONS

PCT Written Opinion, Application No. PCT/CN2018/105723, dated Nov. 23, 2018, 6 pages.: with English translation of relevant part.
China First Office Action, Application No. 201711346849.4, dated Nov. 5, 2019, 12 pps.: with English translation.

* cited by examiner

ARRAY SUBSTRATE COMPRISING LIGHT SHIELDING PORTION AND METHOD FOR MANUFACTURING THE SAME

CROSS REFERENCE TO RELATED APPLICATIONS

This patent application is a National Stage Entry of PCT/CN2018/105723 filed on Sep. 14, 2018, which claims the benefit and priority of Chinese Patent Application No. 201711346849.4 filed on Dec. 15, 2017, the disclosures of which are incorporated by reference herein in their entirety as part of the present application.

BACKGROUND

Embodiments of the present disclosure relate to an array substrate and a method for manufacturing the same.

An organic light emitting diode (OLED) display device has advantages of low energy consumption, high brightness, fast response time, wide viewing angle, light weight, etc., and has recently been widely applied to devices such as mobile communication terminals, personal digital assistants, handheld computers, etc. The OLED display device is divided into a passive matrix type and an active matrix type. The active matrix type OLED display device employs a thin film transistor (TFT) to drive the OLED, and has high luminous efficiency and good display effect.

BRIEF DESCRIPTION

Embodiments of the present disclosure provide an array substrate and a method for manufacturing the same.

A first aspect of the present disclosure provides an array substrate. The array substrate includes a substrate, a thin film transistor located on the substrate, a light emitting device located on the substrate and spaced apart from the thin film transistor in a direction parallel to a surface of the substrate, and a light shielding portion located between the thin film transistor and the light emitting device for shielding a light from the light emitting device.

In an embodiment of the present disclosure, the light shielding portion surrounds a light emitting layer of the light emitting device.

In an embodiment of the present disclosure, the light shielding portion is an electrical connection structure located between one of a source region and a drain region of the thin film transistor and a first electrode of the light emitting device.

In an embodiment of the present disclosure, the light emitting device includes a first electrode, the light emitting layer, and a second electrode which are sequentially disposed in a direction perpendicular to a surface of the substrate. The thin film transistor includes an active layer located on the substrate, a first insulating layer located on the active layer, and a gate located on the first insulating layer. The first insulating layer further covers a surface of the substrate that is not covered by the active layer. The array substrate further includes a second insulating layer located on the gate and the first insulating layer. The first insulating layer and the second insulating layer have a first opening therein. The light emitting device is located within the first opening. The light shielding portion includes a first portion extending along a sidewall of the first opening and electrically connected to the first electrode, a second portion extending on a side, away from the substrate, of the second insulating layer adjacent to the first opening and connected to the first portion, and a third portion connecting the second portion to the active layer via a first hole in the first insulating layer and the second insulating layer.

In an embodiment of the present disclosure, the light emitting device includes a first electrode, the light emitting layer, and a second electrode which are sequentially disposed in a direction perpendicular to a surface of the substrate. The thin film transistor includes an active layer located on the substrate, a first insulating layer located on the active layer, and a gate located on the first insulating layer. The first insulating layer further covers a surface of the substrate that is not covered by the active layer. The first insulating layer has a second opening. The light emitting device is located within the second opening. The array substrate further includes a third insulating layer located on the gate and the first insulating layer. The third insulating layer has a third opening exposing the light emitting device. An orthographic projection of the third opening on the substrate is located within an orthographic projection of the second opening on the substrate. The light shielding portion includes a fourth portion extending on a side, away from the substrate, of the first insulating layer adjacent to the second opening and extending on an edge of the first electrode, wherein the third insulating layer covers the fourth portion, a fifth portion connected to the fourth portion via a second hole in the third insulating layer, a sixth portion extending on a side, away from the substrate, of the third insulating layer adjacent to the third opening and connected to the fifth portion, and a seventh portion connecting the sixth portion to the active layer via a third hole in the first insulating layer and the third insulating layer.

In an embodiment of the present disclosure, the fourth portion of the light shielding portion is disposed in the same layer as the gate.

In an embodiment of the present disclosure, the light emitting device includes a first electrode, the light emitting layer, and a second electrode which are sequentially disposed in a direction perpendicular to a surface of the substrate. The thin film transistor includes a stacked structure composed of a first source/drain electrode layer, an active layer, and a second source/drain electrode layer which are sequentially disposed in the direction perpendicular to the surface of the substrate, a fourth insulating layer covering the substrate, the stacked structure, and the first electrode, and a gate located on the fourth insulating layer. The gate covers at least a side surface of a side, facing the light emitting device, of the active layer. The first electrode further extends below the first source/drain electrode layer and is in contact with the first source/drain electrode layer. The fourth insulating layer has a fourth opening exposing the first electrode. The light emitting layer is located within the fourth opening.

In an embodiment of the present disclosure, the light shielding portion is located between the first electrode and the fourth insulating layer. The light shielding portion includes an eighth portion located on the first electrode and disposed in the same layer as the first source/drain electrode layer, and a ninth portion located on the eighth portion and disposed in the same layer as the second source/drain electrode layer.

In an embodiment of the present disclosure, the light shielding portion further includes a tenth portion disposed in the same layer as the gate. The tenth portion is located on the fourth insulating layer and is in contact with the ninth portion via a fourth hole in the fourth insulating layer.

In an embodiment of the present disclosure, the light emitting device includes a first electrode, the light emitting layer, and a second electrode which are sequentially disposed in a direction perpendicular to a surface of the substrate. The thin film transistor includes a stacked structure composed of a first source/drain electrode layer, an active layer, and a second source/drain electrode layer which are sequentially disposed in the direction perpendicular to the surface of the substrate, a fourth insulating layer covering the substrate, the stacked structure, and the first electrode, and a gate located on the fourth insulating layer, the gate covering at least a side surface of a side, facing the light emitting device, of the active layer, wherein the first electrode further extends below the first source/drain electrode layer and is in contact with the first source/drain electrode layer. The fourth insulating layer has a fourth opening exposing the first electrode. The light emitting layer is located within the fourth opening. The light shielding portion includes an eleventh portion disposed in the same layer as the gate. The eleventh portion has at least a portion extending along a sidewall of the fourth opening.

A second aspect of the present disclosure provides a display device including the array substrate described in the first aspect of the present disclosure.

A third aspect of the present disclosure provides a method for manufacturing an array substrate. The method includes providing a substrate, forming a thin film transistor on the substrate, forming a light emitting device spaced apart from the thin film transistor on the substrate in a direction parallel to a surface of the substrate, and forming a light shielding portion for shielding a light from the light emitting device between the thin film transistor and the light emitting device.

In an embodiment of the present disclosure, the method includes forming an active layer of the thin film transistor on the substrate, forming a first insulating layer on the substrate and the active layer, forming a second opening in the first insulating layer, forming a first electrode in the second opening, forming a first conductive material layer on the first insulating layer and the first electrode, patterning the first conductive material layer to form a gate of the thin film transistor and a fourth portion of the light shielding portion, wherein the fourth portion is located on a side, away from the substrate, of the first insulating layer adjacent to the second opening and covers an edge of the first electrode, forming a third insulating layer on the first insulating layer and the fourth portion, patterning the third insulating layer to form a second hole exposing the fourth portion, a third hole exposing the active layer, and a third opening exposing the first electrode in the third insulating layer, forming a fifth portion, a sixth portion, and a seventh portion of the light shielding portion on the third insulating layer, wherein the fifth portion is connected to the fourth portion via the second hole in the third insulating layer, the sixth portion extends on a side, away from the substrate, of the third insulating layer adjacent to the third opening and is connected to the fifth portion, and the seventh portion connects the sixth portion to the active layer via the third hole in the first insulating layer and the third insulating layer, sequentially forming the light emitting layer and the second electrode of the light emitting device on the first electrode.

In an embodiment of the present disclosure, the method includes forming a first electrode of the light emitting device on the substrate, forming a second conductive material layer on the substrate and the first electrode, patterning the second conductive material layer to form a first source/drain electrode layer of the thin film transistor and an eighth portion of the light shielding portion on the first electrode, the eighth portion surrounding a region where a light emitting layer of the light emitting device is to be formed, forming an active layer of the thin film transistor on the first source/drain electrode layer, forming a third conductive material layer to cover the substrate, the first electrode, the active layer, and the eighth portion, patterning the third conductive material layer to form a second source/drain electrode layer on the active layer and a ninth portion of the light shielding portion on the eighth portion.

In an embodiment of the present disclosure, the method further includes forming a fourth insulating layer to cover the substrate, the first source/drain electrode layer, the active layer and the second source/drain electrode layer, the first electrode, and the light shielding portion, patterning the fourth insulating layer to form a fourth hole exposing the ninth portion and a fourth opening exposing the first electrode in the fourth insulating layer, forming a fourth conductive material layer on the fourth insulating layer and the first electrode, patterning the fourth conductive material layer to form a gate of the thin film transistor and a tenth portion of the light shielding portion, wherein the tenth portion is in contact with the ninth portion via the fourth hole.

In an embodiment of the present disclosure, the method includes forming a first electrode on the substrate, sequentially forming a first source/drain electrode layer, an active layer, and a second source/drain electrode layer of the thin film transistor on the first electrode, the first source/drain electrode layer, the active layer, and the second source/drain electrode layer constituting a stacked structure, forming a fourth insulating layer on the substrate, the stacked structure, and the first electrode, patterning the fourth insulating layer to form a fourth opening exposing the first electrode in the fourth insulating layer, forming a fifth conductive material layer on the fourth insulating layer and the first electrode, patterning the fifth conductive material layer to form a gate of the thin film transistor and a eleventh portion of the light shielding portion, wherein the gate covers at least a side surface of a side, facing the light emitting device, of the active layer, and the eleventh portion has at least a portion extending along a sidewall of the fourth opening.

Adaptive and further aspects and scope will become apparent from the description provided herein. It should be understood that various aspects of this disclosure may be implemented individually or in combination with one or more other aspects. It should also be understood that the description and specific examples herein are intended for purposes of illustration only and are not intended to limit the scope of the present disclosure.

BRIEF DESCRIPTION OF THE DRAWINGS

The drawings described herein are for illustrative purposes only of selected embodiments and not all possible implementations, and are not intended to limit the scope of the present application.

Corresponding reference numerals indicate corresponding parts or features throughout the several views of the drawings.

DETAILED DESCRIPTION

As used herein and in the appended claims, the singular form of a word includes the plural, and vice versa, unless the context clearly dictates otherwise. Thus, the references "a", "an", and "the" are generally inclusive of the plurals of the respective terms. Similarly, the words "comprise", "comprises", and "comprising" are to be interpreted inclusively rather than exclusively. Likewise, the terms "include", "including" and "or" should all be construed to be inclusive, unless such a construction is clearly prohibited from the context. Where used herein the term "examples," particularly when followed by a listing of terms is merely exemplary and illustrative, and should not be deemed to be exclusive or comprehensive.

Additionally, further to be noted, when the elements and the embodiments thereof of the present application are introduced, the articles "a/an", "one", "the" and "said" are intended to represent the existence of one or more elements. Unless otherwise specified, "a plurality of" means two or more. The expressions "comprise", "include", "contain" and "have" are intended as inclusive and mean that there may be other elements besides those listed. The terms such as "first" and "second" are used herein only for purposes of description and are not intended to indicate or imply relative importance and the order of formation.

The flow diagrams depicted herein are just one example. There may be many variations to this diagram or the steps (or operations) described therein without departing from the spirit of the disclosure. For instance, the steps may be performed in a differing order or steps may be added, deleted, or modified. All of these variations are considered a part of the claimed disclosure.

Example embodiments will now be described more fully with reference to the accompanying drawings.

At present, light emitted from a light emitting layer in an OLED light emitting device is irradiated to an active layer of a TFT, thereby causing deterioration of the TFT device.

In an embodiment of the present disclosure, an array substrate and a method for manufacturing the same are provided. The array substrate includes a light shielding portion located between a TFT and an OLED light emitting device, which can effectively prevent light emitted from a light emitting layer in the OLED light emitting device from being irradiated to an active layer of the TFT, thereby preventing deterioration of the TFT.

An array substrate according to an embodiment of the present disclosure may include a substrate, a thin film transistor located on the substrate, a light emitting device located on the substrate and spaced apart from the thin film transistor in a direction parallel to a surface of the substrate, a light shielding portion located between the thin film transistor and the light emitting device for shielding a light from the light emitting device.

Figure 1:
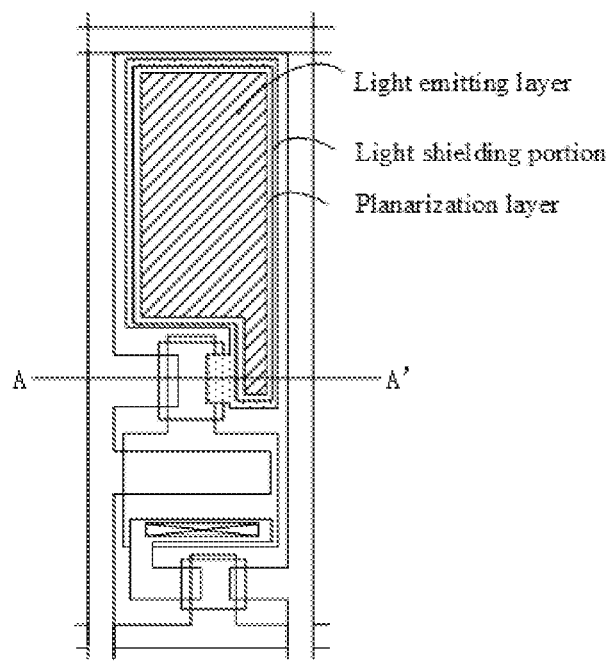
FIG. 1 is a top schematic view showing an array substrate according to an embodiment of the present disclosure.

FIG. 1 is a top schematic view showing an array substrate according to an embodiment of the present disclosure. As shown in FIG. 1, the light shielding portion surrounds a light emitting layer of the light emitting device.

Figure 2:
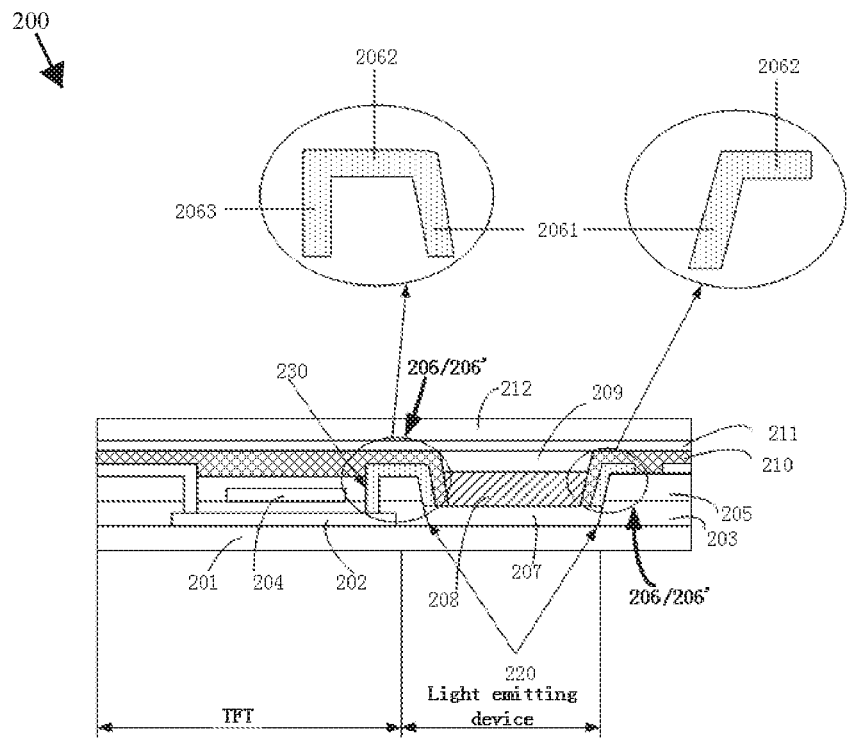
FIG. 2 is a schematic view showing a cross-section structure of an array substrate taken along line AA' in FIG. 1 according to an embodiment of the present disclosure.

FIG. 2 is a schematic view showing a cross-section structure of an array substrate 200 taken along line AA' in FIG. 1 according to an embodiment of the present disclosure. As shown in FIG. 2, in an embodiment of the present disclosure, the array substrate 200 includes a substrate 201, a thin film transistor located on the substrate 201, a light emitting device located on the substrate 201 and spaced apart from the thin film transistor in a direction parallel to a surface of the substrate, and a light shielding portion 206 located between the thin film transistor and the light emitting device for shielding a light from the light emitting device.

In an exemplary embodiment of the present disclosure, as shown in FIG. 2, the light emitting device includes a first electrode 207, a light emitting layer 208, and a second electrode 209 which are sequentially disposed in a direction perpendicular to a surface of the substrate 201. The thin film transistor includes an active layer 202 located on the substrate 201, a first insulating layer 203 located on the active layer 202, and a gate 204 located on the first insulating layer 203.

According to an embodiment of the present disclosure, the light shielding portion 206 in the embodiment shown in FIG. 2 may be an electrical connection structure 206' located between one of a source region and a drain region (i.e., the source region and the drain region of the active layer 202) of the thin film transistor and the first electrode 207. According to an embodiment of the present disclosure, the light shielding portion may also serve as a source/drain electrode of the thin film transistor.

The first insulating layer 203 further covers a surface of the substrate 201 that is not covered by the active layer 202. The array substrate 200 further includes a second insulating layer 205 located on the gate 204 and the first insulating layer 203, for example, an interlayer insulating layer. The first insulating layer 203 and the second insulating layer 205 have a first opening 220 adjacent to the active layer 202 and exposing the substrate 201. The light emitting device is located within the first opening 220.

As shown in the enlarged detail view of FIG. 2, the light shielding portion 206 includes a first portion 2061, a second portion 2062, and a third portion 2063. The first portion 2061 extends along a sidewall of the first opening 220 and is electrically connected to the first electrode 207. The second portion 2062 extends on a side, away from the substrate 201, of the second insulating layer 205 adjacent to the first opening 220 and is connected to the first portion 2061. The third portion 2063 connects the second portion 2062 to the active layer 202 via a first hole 230 in the first insulating layer 203 and the second insulating layer 205.

The array substrate 200 may further include a planarization layer 210 located on the thin film transistor and the light emitting device, a further insulating layer 211 located on the planarization layer 210, and an encapsulation layer 212 located on the further insulating layer 211.

Figure 3:
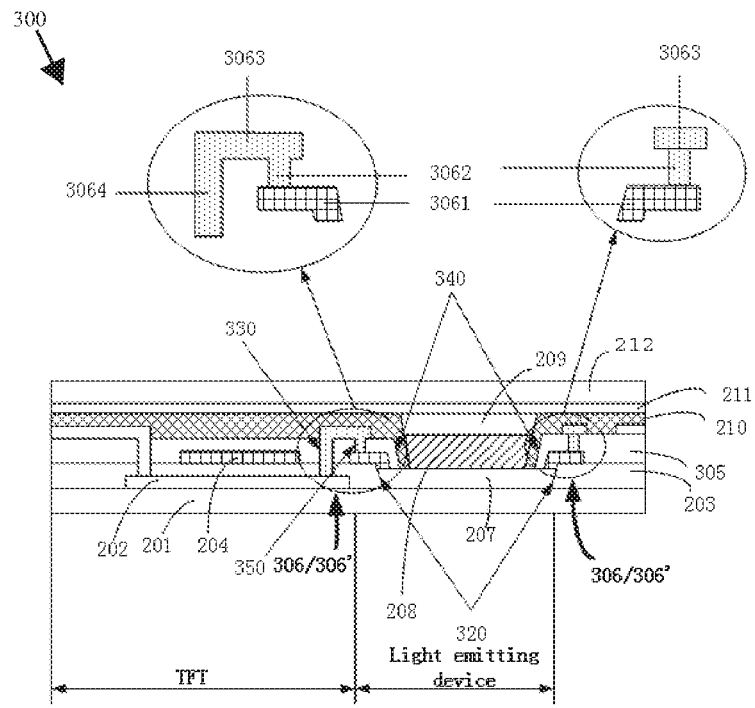
FIG. 3 is a schematic view showing a cross-section structure of an array substrate taken along line AA' in FIG. 1 according to an embodiment of the present disclosure.

FIG. 3 is a schematic view showing a cross-section structure of an array substrate 300 taken along line AA' in FIG. 1 according to an embodiment of the present disclosure. The embodiment shown in FIG. 3 is a modification of the embodiment shown in FIG. 2. The difference between FIG. 3 and FIG. 2 lies in the difference in the light shielding portion.

Similarly, according to an embodiment of the present disclosure, the light shielding portion 306 in the embodiment shown in FIG. 3 may be an electrical connection structure 306' located between one of a source region and a drain region (i.e., the source region and the drain region of the active layer 202) of the thin film transistor and the first electrode 207. According to an embodiment of the present disclosure, the light shielding portion may also serve as a source/drain electrode of the thin film transistor.

As shown in FIG. 3, the first insulating layer 203 also covers a surface of the substrate 201 that is not covered by the active layer 202. The first insulating layer 203 has a second opening 320 adjacent to the active layer 202 and exposing the substrate 201. The light emitting device is located within the second opening 320. The array substrate 300 further includes a third insulating layer 305 located on the gate 204 and the first insulating layer 203. The third insulating layer 305 has a third opening 340 adjacent to the active layer 202 and exposing the light emitting device. An orthographic projection of the third opening 340 on the substrate 201 is located within an orthographic projection of the second opening 320 on the substrate 201.

In an exemplary embodiment of the present disclosure, as shown in an enlarged detail view in FIG. 3, the light shielding portion 306 includes a fourth portion 3061, a fifth portion 3062, a sixth portion 3063, and a seventh portion 3064. The fourth portion 3061 extends on a side, away from the substrate 201, of the first insulating layer 203 adjacent to the second opening 320 and extends on an edge of the first electrode 207. The third insulating layer 305 covers the fourth portion 3061. The fifth portion 3062 is connected to the fourth portion 3061 via a second hole 350 in the third insulating layer 305. The sixth portion 3063 extends on a side, away from the substrate 201, of the third insulating layer 305 adjacent to the third opening 340 and is connected to the fifth portion 3062. The seventh portion 3064 connects the sixth portion 3063 to the active layer 202 via a third hole 330 in the first insulating layer 203 and the third insulating layer 305.

In an exemplary embodiment of the present disclosure, the fourth portion 3061 of the light shielding portion 306 is disposed in the same layer as the gate 204, that is, formed of the same film layer.

It should be noted that the position and the connection relationship between other components in FIG. 3 can be referred to the description about FIG. 2, and details are not described herein again.

Figure 4:
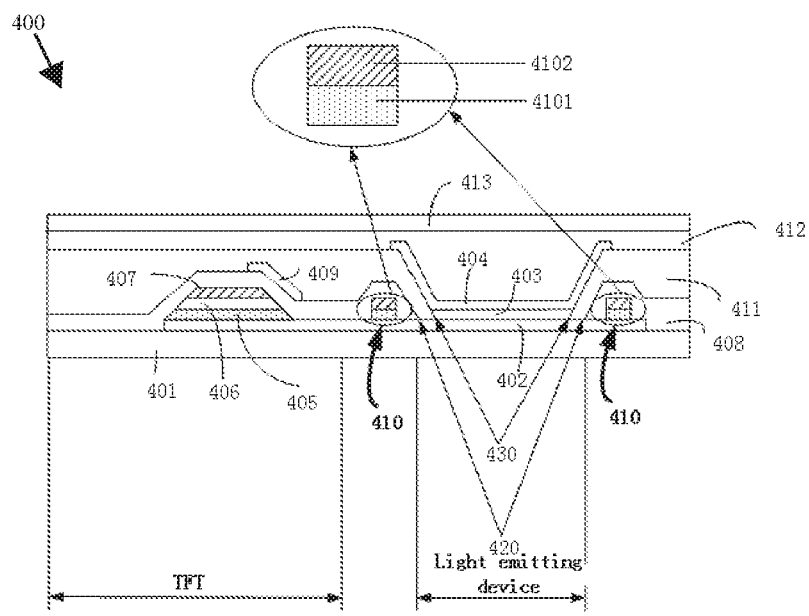
FIG. 4 is a schematic view showing a cross-section structure of an array substrate according to an embodiment of the present disclosure.
Figure 5:
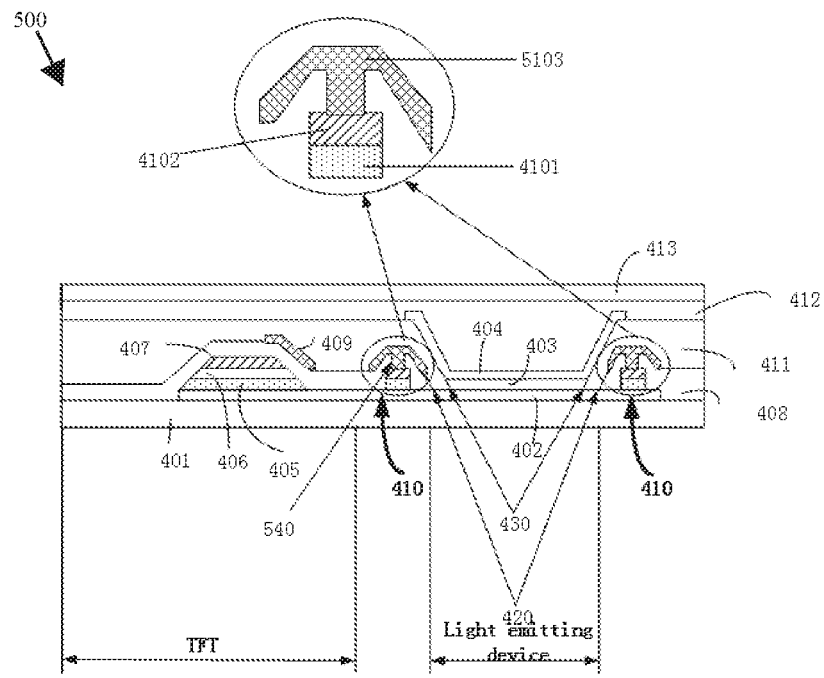
FIG. 5 is a schematic view showing a cross-section structure of an array substrate according to an embodiment of the present disclosure.
Figure 6:
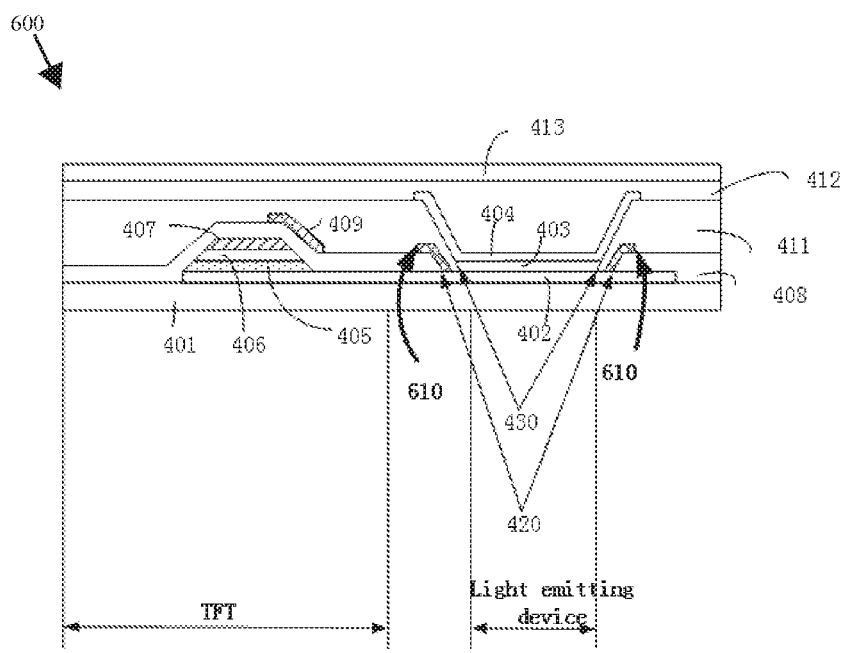
FIG. 6 is a schematic view showing a cross-section structure of an array substrate according to an embodiment of the present disclosure.

FIGS. 4, 5, and 6 are schematic views showing cross-section structures of an array substrate, respectively, according to an embodiment of the present disclosure. Similar to FIG. 1, the light shielding portion in the array substrate of the embodiments of FIGS. 4, 5, and 6 also surrounds a light emitting layer of the light emitting device. However, the light shielding portion in the array substrate of the embodiments of FIGS. 4, 5, and 6 is not an electrical connection between one of the source region and the drain region of the thin film transistor and the electrode of the light emitting device.

FIG. 4 is a schematic view showing a cross-section structure of an array substrate 400 according to an embodiment of the present disclosure. As shown in FIG. 4, the array substrate 400 includes a substrate 401, a thin film transistor located on the substrate 401, a light emitting device located on the substrate 401 adjacent to the thin film transistor in a direction parallel to a surface of the substrate, and a light shielding portion 410 located between the thin film transistor and the light emitting device.

As shown in FIG. 4, the light emitting device includes a first electrode 402, a light emitting layer 403, and a second electrode 404 which are sequentially disposed in a direction perpendicular to a surface of the substrate 401. The thin film transistor includes a stacked structure composed of a first source/drain electrode layer 405, an active layer 406, and a second source/drain electrode layer 407 which are sequentially disposed in a direction perpendicular to a surface of the substrate 401, a fourth insulating layer 408 covering the substrate 401, the stacked structure and the first electrode 402, and a gate 409 located on the fourth insulating layer 408. The gate 409 covers at least a side surface of a side, facing the light emitting device, of the active layer 406. The first electrode 402 also extends below the first source/drain electrode layer 405 and is in contact with the first source/drain electrode layer 405.

As shown in FIG. 4, the fourth insulating layer 408 has a fourth opening 420 adjacent to the active layer 406 and exposing the first electrode 402. The light emitting layer 403 is located within the fourth opening 420. The light shielding portion 410 is located between the first electrode 402 and the fourth insulating layer 408. As shown in the enlarged detail view of FIG. 4, the light shielding portion 410 includes an eighth portion 4101 located on the first electrode 402 and disposed in the same layer as the first source/drain electrode layer 405, and a ninth portion 4102 located on the eighth portion 4101 and disposed in the same layer as the second source/drain electrode layer 407.

The array substrate 400 further includes a passivation layer 411 covering the thin film transistor, the first electrode 402, and the fourth insulating layer 408. The passivation layer 411 has a fifth opening 430 adjacent to the active layer 406 and exposing the first electrode 402. An orthographic projection of the fifth opening 430 on the first electrode 402 is located within the fourth opening 420. The light emitting layer 403 is located within the fifth opening 430. The second electrode 404 is located on the light emitting layer 403 and the passivation layer 411.

The array substrate 400 further includes an additional insulating layer 412 located on the passivation layer 411 and the light emitting device, and an encapsulation layer 413 located on the additional insulating layer 412.

FIG. 5 is a schematic view showing a cross-section structure of an array substrate 500 according to an embodiment of the present disclosure. The embodiment shown in FIG. 5 is a modification of the embodiment shown in FIG. 4. In FIG. 5, the light shielding portion 410 further includes a tenth portion 5103.

As shown in the enlarged detail view of FIG. 5, the light shielding portion 410 further includes a tenth portion 5103 disposed in the same layer as the gate 409. The tenth portion 5103 is located on the fourth insulating layer 408 and is in contact with the ninth portion 4102 via a fourth hole 540 in the fourth insulating layer 408.

It should be noted that the position and the connection relationship between other components in FIG. 5 can be referred to the description about FIG. 4, and details are not described herein again.

FIG. 6 is a schematic view showing a cross-section structure of an array substrate 600 according to an embodiment of the present disclosure. The embodiment shown in FIG. 6 is a modification of the embodiment shown in FIG. 4. The difference between FIG. 6 and FIG. 4 lies in the difference in the light shielding portion.

In an exemplary embodiment of the present disclosure, as shown in FIG. 6, the light shielding portion 610 includes a eleventh portion 610 disposed in the same layer as the gate 409. The eleventh portion 610 has at least a portion that extends along a sidewall of the fourth opening 420.

It should be noted that the position and the connection relationship between the other components in FIG. 6 can be referred to the description about FIG. 4, and details are not described herein again.

In an exemplary embodiment of the present disclosure, although the top surface of the light shielding portions 206, 306, 410, 610 is shown to be higher than the top surface of the light emitting layers 208, 403, it should be noted that the top surface of the light shielding portion may also be lower than the top surface of the light emitting layer or be flush with the top surface of the light emitting layer as long as the light shielding portion can shield at least part of the light from the light emitting layer.

In an exemplary embodiment of the present disclosure, there is also provided a display device including the array substrate as described above.

In an exemplary embodiment of the present disclosure, a method for manufacturing an array substrate is also provided. The method can manufacture an array substrate having a light shielding portion located on a thin film transistor and a light emitting device, thereby being capable of effectively preventing light emitted from a light emitting layer of the light emitting device from being irradiated to an active layer of the TFT, and thus preventing deterioration of the TFT.

Figure 7:
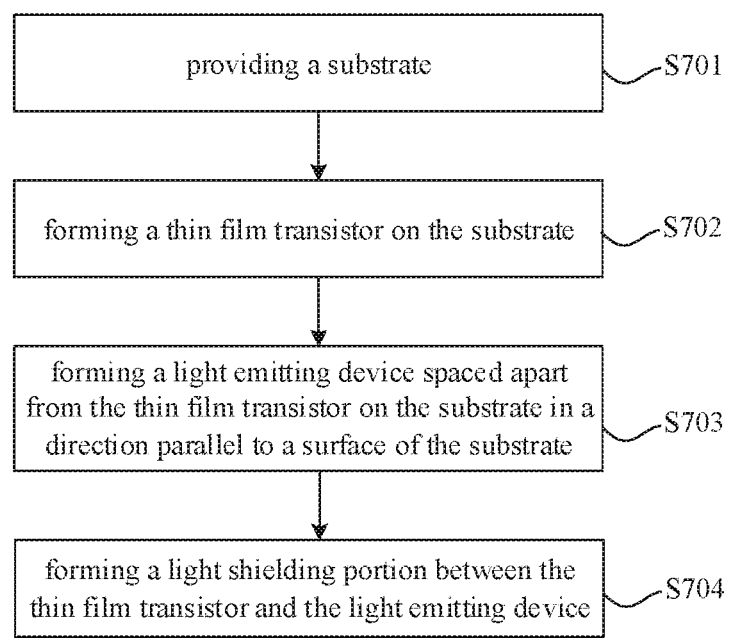
FIG. 7 is a flow chart of a method for manufacturing an array substrate according to an embodiment of the present disclosure.

FIG. 7 is a flow chart of a method for manufacturing an array substrate according to an embodiment of the present disclosure. As shown in FIG. 7, in step S701, a substrate is provided, in step S702, a thin film transistor is formed on the substrate, and in step S703, a light emitting device spaced apart from the thin film transistor is formed on the substrate in a direction parallel to a surface of the substrate, and in step S704, a light shielding portion for shielding a light from the light emitting device is formed between the thin film transistor and the light emitting device.

Next, a method for manufacturing an array substrate will be described in detail with reference to FIGS. 8A to 12C.

FIGS. 8A to 8F are schematic views of a method for manufacturing an array substrate according to an embodiment of the present disclosure, wherein the array substrate as formed is shown in FIG. 2.

Figure 8A:
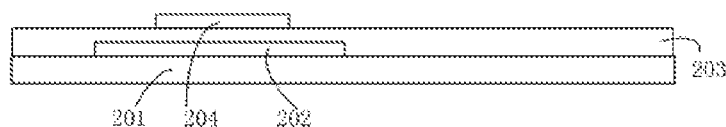
FIGS. 8A to 8F are schematic views of a method for manufacturing an array substrate according to an embodiment of the present disclosure.

As shown in FIG. 8A, forming a thin film transistor includes forming an active layer 202 on a substrate 201, forming a first insulating layer 203 on the substrate 201 and the active layer 202, and forming a gate 204 on the first insulating layer 203.

Figure 8B:
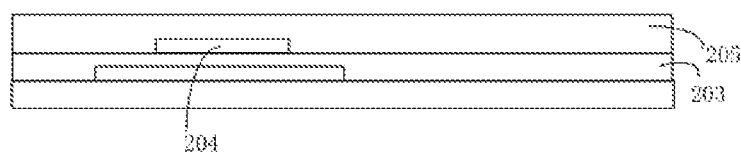

As shown in FIG. 8B, the method according to the present disclosure further includes forming a second insulating layer 205 on the gate 204 and the first insulating layer 203.

Figure 8C:
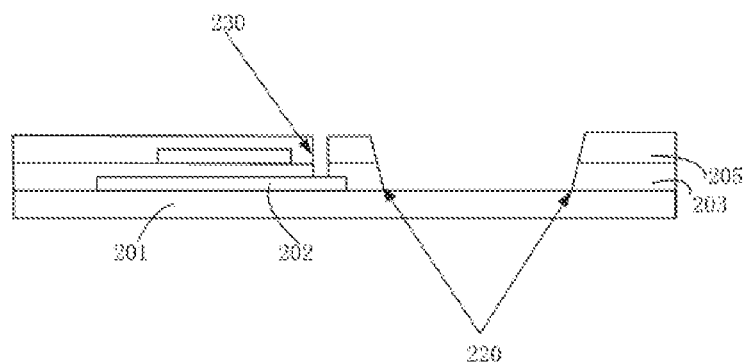

As shown in FIG. 8C, the first insulating layer 203 and the second insulating layer 205 are patterned to form a first hole 230 exposing the active layer 202 and a first opening 220 exposing the substrate 201 in the first insulating layer 203 and the second insulating layer 205.

Figure 8D:
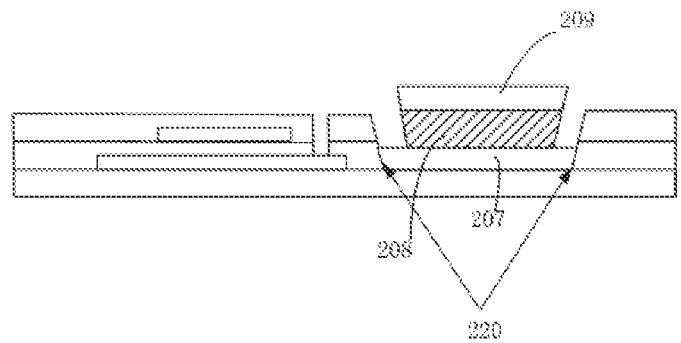

As shown in FIG. 8D, forming the light emitting device includes sequentially forming a first electrode 207, a light emitting layer 208, and a second electrode 209 in the first opening 220.

Figure 8E:
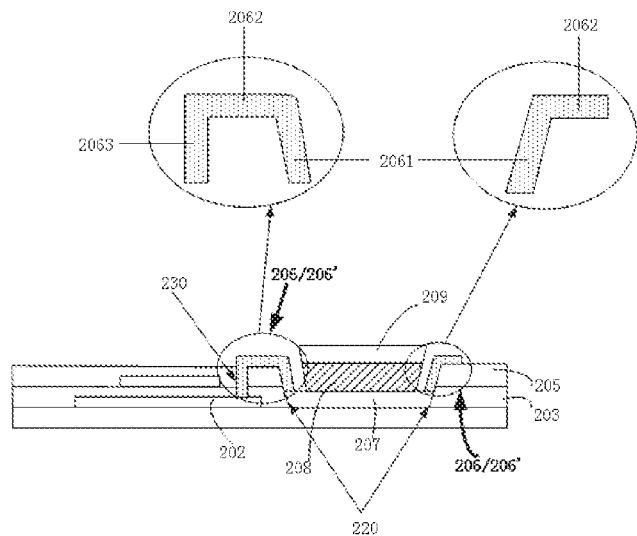

As shown in FIG. 8E, forming the light shielding portion 206 includes forming a first portion 2061, a second portion 2062, and a third portion 2063 of the light shielding portion 206 on the second insulating layer 205.

As shown in the enlarged detail view of FIG. 8E, the first portion 2061 extends along a sidewall of the first opening 220 and is electrically connected to the first electrode 207. The second portion 2062 extends on a side, away from the substrate 201, of the second insulating layer 205 adjacent to the first opening 220 and is connected to the first portion 2061. The third portion 2063 connects the second portion 2062 to the active layer 202 via a first hole 230 in the first insulating layer 203 and the second insulating layer 205.

Figure 8F:
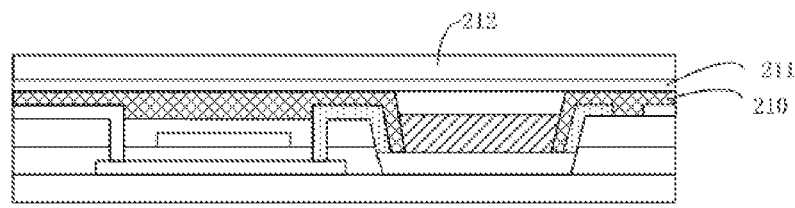

The method according to the present disclosure as shown in FIG. 8F further includes forming a planarization layer 210 on the thin film transistor and the light emitting device, forming a further insulating layer 211 on the planarization layer 210, and forming an encapsulation layer 212 on the further insulating layer 211.

FIGS. 9A to 9I are schematic views of a method for manufacturing an array substrate according to an embodiment of the present disclosure, wherein the array substrate as formed is shown in FIG. 3.

Figure 9A:
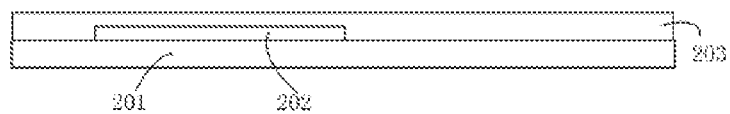
FIGS. 9A to 9I are schematic views of a method for manufacturing an array substrate according to an embodiment of the present disclosure.

As shown in FIG. 9A, an active layer 202 is formed on the substrate 201, and a first insulating layer 203 is formed on the substrate 201 and the active layer 202.

Figure 9B:
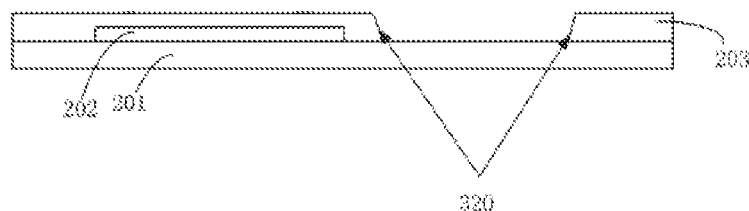

As shown in FIG. 9B, a second opening 320 adjacent to the active layer 202 and exposing the substrate 201 is formed in the first insulating layer 203.

Figure 9C:
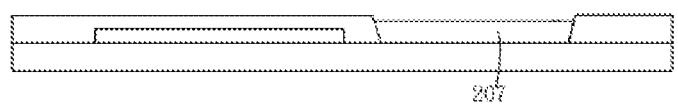

As shown in FIG. 9C, a first electrode 207 is formed in the second opening 320.

Figure 9D:
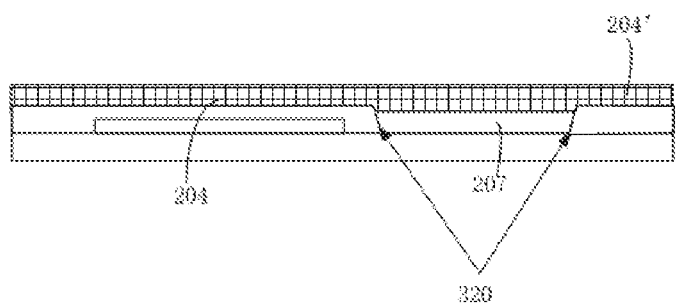

As shown in FIG. 9D, a first conductive material layer 204' is formed on the first insulating layer 203 and the first electrode 207.

Figure 9E:
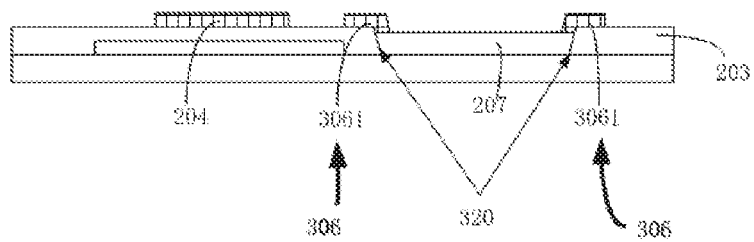

As shown in FIG. 9E, the first conductive material layer 204' is patterned to form a gate 204 of the thin film transistor and a fourth portion 3061 of the light shielding portion 306. The fourth portion 3061 is located on a side, away from the substrate 201, of the first insulating layer 203 adjacent to the second opening 320 and covers an edge of the first electrode 207.

Figure 9F:
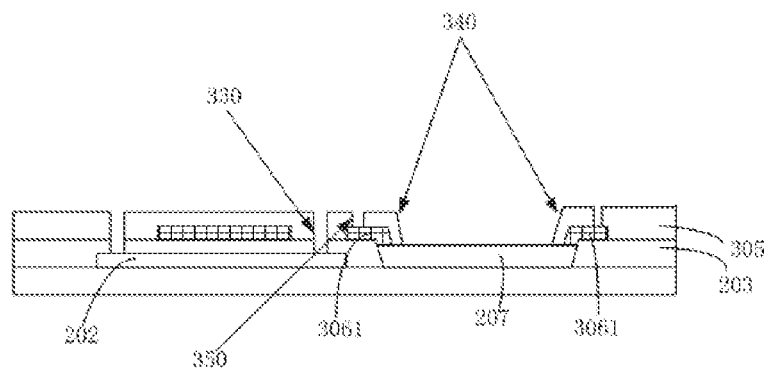

The method according to the present disclosure as shown in FIG. 9F further includes forming a third insulating layer 305 on the first insulating layer 203 and the fourth portion 3061, and patterning the third insulating layer 305 to form a second hole 350 exposing the fourth portion 3061, a third hole 330 exposing the active layer 202, and a third opening 340 exposing the first electrode 207 in the third insulating layer 305.

Figure 9G:
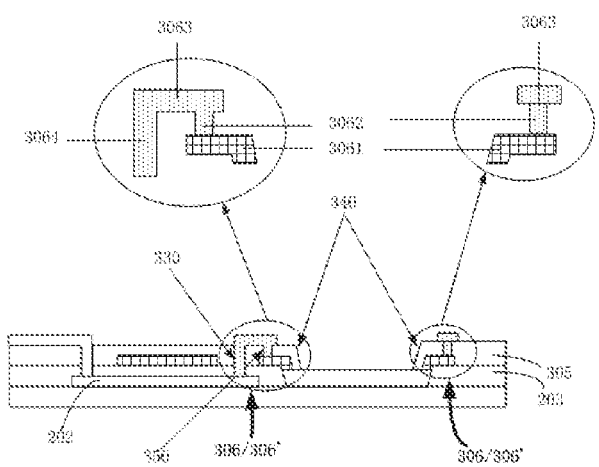

As shown in FIG. 9G, forming the light shielding portion 306 further includes forming a fifth portion 3062, a sixth portion 3063, and a seventh portion 3064 of the light shielding portion 306 on the third insulating layer 305.

As shown in the enlarged detail view in FIG. 9G, the fifth portion 3062 is connected to the fourth portion 3061 via a second hole 350 in the third insulating layer 305. The sixth portion 3063 extends on a side, away from the substrate 201, of the third insulating layer 305 adjacent to the third opening 340 and is connected to the fifth portion 3062. The seventh portion 3064 connects the sixth portion 3063 to the active layer 202 via a third hole 330 in the first insulating layer 203 and the third insulating layer 305.

Figure 9H:
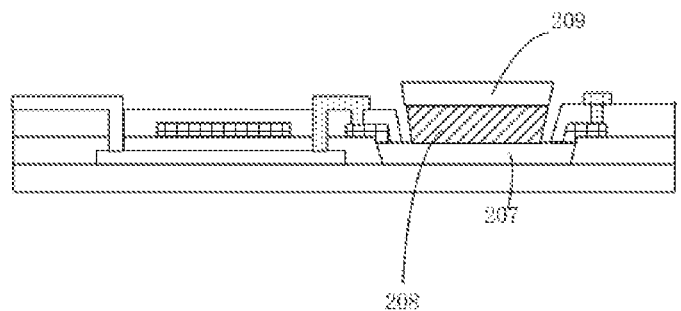

As shown in FIG. 9H, forming the light emitting device further includes sequentially forming a light emitting layer 208 and a second electrode 209 on the first electrode 207.

Figure 9I:
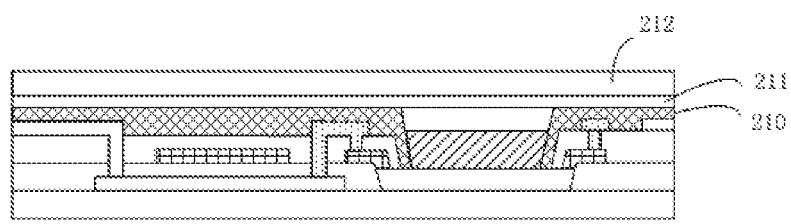

As shown in FIG. 9I, the method according to the present disclosure further includes forming a planarization layer 210 on the thin film transistor and the light emitting device, forming a further insulating layer 211 on the planarization layer 210, and forming an encapsulation layer 212 on the further insulating layer 211.

Figure 10A:
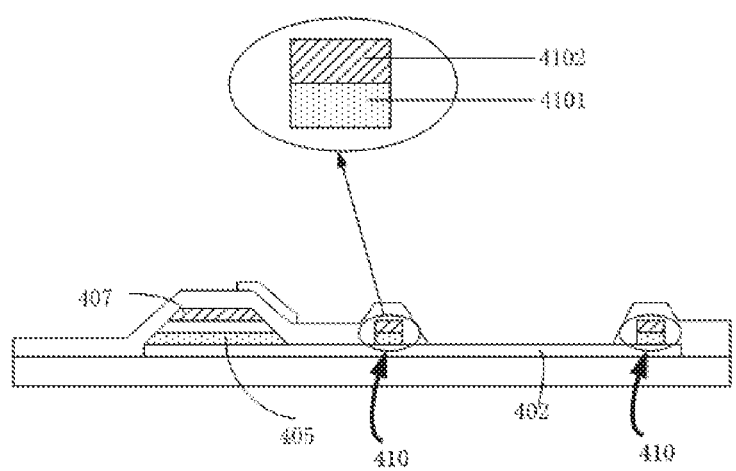
FIGS. 10A and 10B are schematic views of a method for manufacturing an array substrate according to an embodiment of the present disclosure.
Figure 10B:
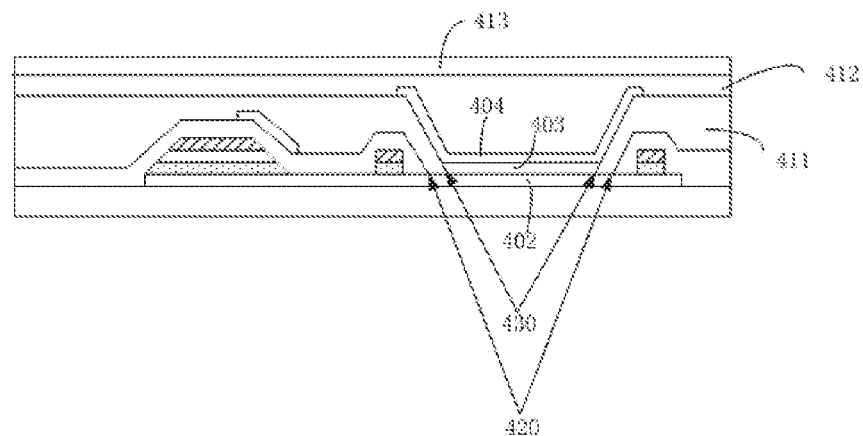

FIGS. 10A and 10B are schematic views of a method for manufacturing an array substrate according to an embodiment of the present disclosure, wherein the array substrate as formed is shown in FIG. 4.

As shown in FIG. 10A, a first electrode 402 of a light emitting device is formed on a substrate 401. A second conductive material layer 405' is formed on the substrate 401 and the first electrode 402. The second conductive material layer is patterned to form a first source/drain electrode layer 405 of the thin film transistor and an eighth portion 4101 of the light shielding portion 410 on the first electrode 402, the eighth portion 4101 surrounding a region where a light emitting layer of the light emitting device is to be formed. An active layer 406 of the thin film transistor is formed on the first source/drain electrode layer 405. A third conductive material layer is formed to cover the substrate 401, the first electrode 402, the active layer 406, and the eighth portion 4101. The third conductive material layer is patterned to form a second source/drain electrode layer 407 on the active layer 406 and a ninth portion 4102 of the light shielding portion 410 on the eighth portion 4101. The first source/drain electrode layer 405, the active layer 406, and the second source/drain electrode layer 407 constitute a stacked structure.

Forming the thin film transistor further includes forming a fourth insulating layer 408 on the substrate 401, the stacked structure and the first electrode 402, patterning the fourth insulating layer 408 to form a fourth opening 420 exposing the first electrode 402 in the fourth insulating layer 408, and forming a gate 409 on the fourth insulating layer 408. The gate 409 covers at least a side surface of a side facing the light emitting device (which may be considered to be a side facing the fourth opening 420) of the active layer 406.

As shown in the enlarged detail view of FIG. 10A, the eighth portion 4101 is disposed in the same layer as the first source/drain electrode layer 405. The ninth portion 4102 is located on the eighth portion 4101 and is disposed in the same layer as the second source/drain electrode layer 407.

As shown in FIG. 10B, the method according to the present disclosure further includes forming a passivation layer 411 on the thin film transistor and the first electrode 402, and patterning the passivation layer 411 to form a fifth opening 430 exposing the first electrode 402 in the passivation layer 411. An orthographic projection of the fifth opening 430 on the first electrode 402 is located within the fourth opening 420.

Forming the light emitting device includes forming a light emitting layer 403 on the first electrode 402, and forming a second electrode 404 on the light emitting layer 403 and on a sidewall of the fifth opening 430.

Forming the array substrate further includes forming an additional insulating layer 412 on the passivation layer 411 and the light emitting device, and forming an encapsulation layer 413 on the additional insulating layer 412.

Figure 11A:
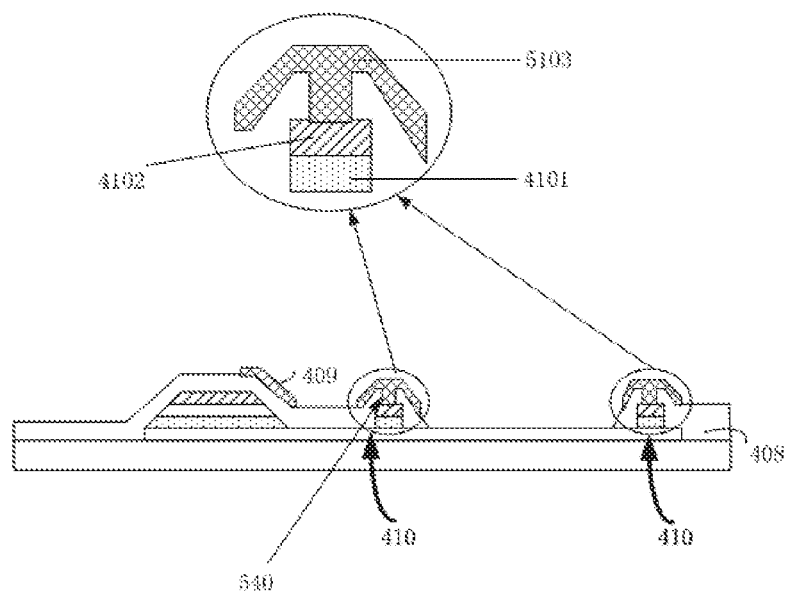
FIGS. 11A and 11B are schematic views of a method for manufacturing an array substrate according to an embodiment of the present disclosure.
Figure 11B:
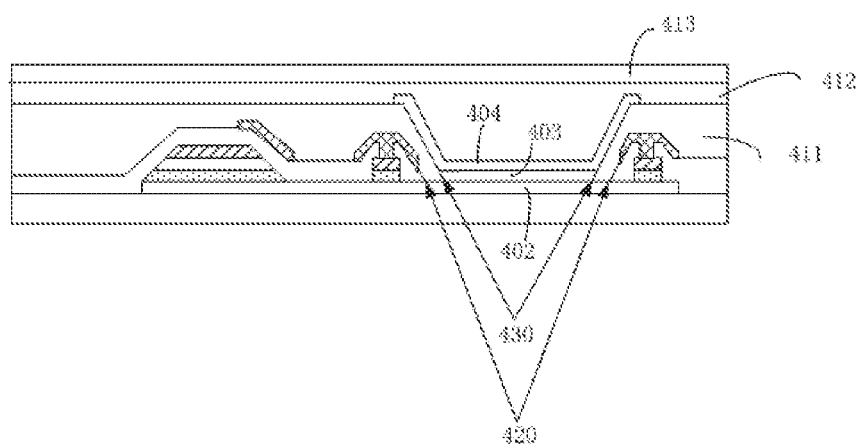

FIGS. 11A to 11B are schematic views of a method for manufacturing an array substrate according to an embodiment of the present disclosure, wherein the array substrate as formed is shown in FIG. 5. It should be noted that the method is performed on the basis of the array substrate shown in FIG. 10A.

As shown in FIG. 11A, patterning the fourth insulating layer 408 further includes forming a fourth hole 540 exposing the ninth portion 4102 in the fourth insulating layer 408.

Next, a fourth conductive material layer is formed on the fourth insulating layer 408 and the first electrode 402. The fourth conductive material layer is patterned to form a gate 409 of the thin film transistor and a tenth portion 5103 of the light shielding portion 410. As shown in the enlarged detail view in FIG. 11A, the tenth portion 5103 is disposed in the same layer as the gate 409. The tenth portion 5103 is in contact with the ninth portion 4102 via the fourth hole 540.

As shown in FIG. 11B, the steps after forming the light shielding portion 410 are the same as those shown in FIG. 10B. For detailed description of the steps, reference may be made to the above description of FIG. 10B, and details are not described herein again.

Figure 12A:
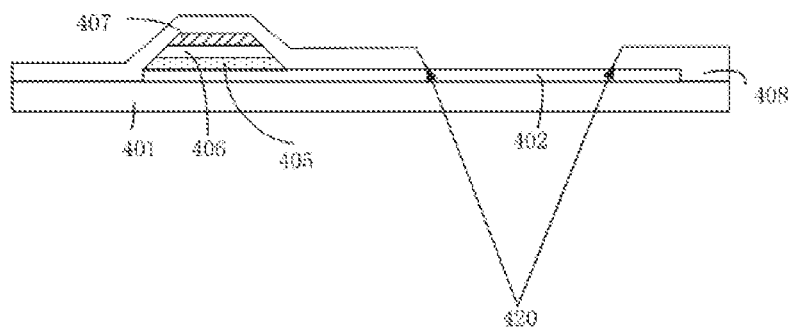
FIGS. 12A to 12C are schematic views of a method for manufacturing an array substrate according to an embodiment of the present disclosure.
Figure 12B:
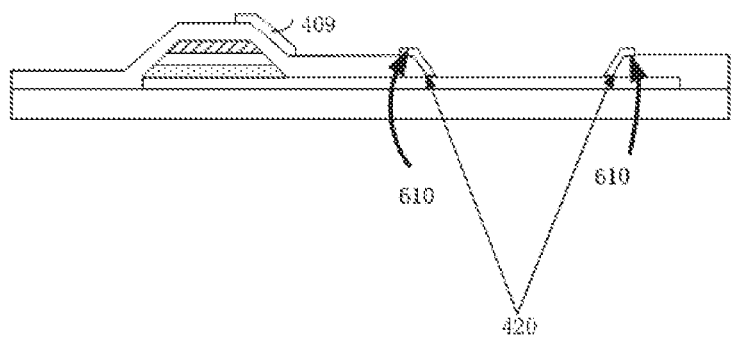
Figure 12C:
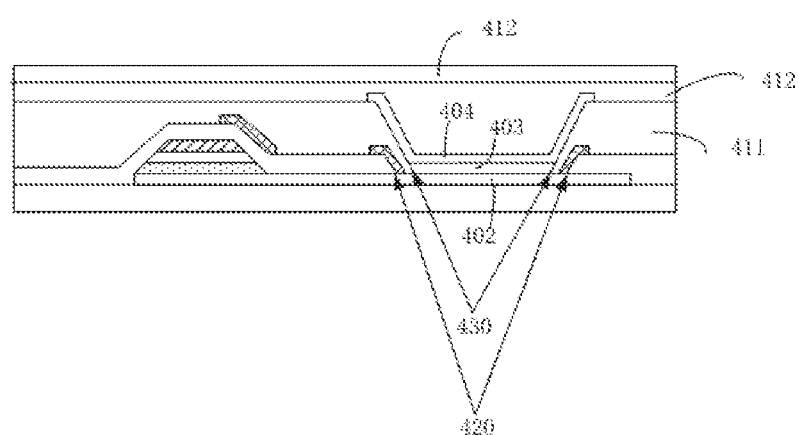

FIGS. 12A to 12C are schematic views of a method for manufacturing an array substrate according to an embodiment of the present disclosure, wherein the array substrate as formed is shown in FIG. 6. It should be noted that the method shown in FIG. 12A is similar to the method shown in FIG. 10A.

Specifically, as shown in FIG. 12A, a first electrode 402 of a light emitting device is formed on a substrate 401. A first source/drain electrode layer 405, an active layer 406, and a second source/drain electrode layer 407 of a thin film transistor are sequentially formed on the first electrode 402. The first source/drain electrode layer 405, the active layer 406, and the second source/drain electrode layer 407 constitute a stacked structure. A fourth insulating layer 408 is formed on the substrate 401, the stacked structure, and the first electrode 402. The fourth insulating layer 408 is patterned to form a fourth opening 420 exposing the first electrode 402 in the fourth insulating layer 408.

As shown in FIG. 12B, a fifth conductive material layer is formed on the fourth insulating layer 408 and the first electrode 402. The fifth conductive material layer is patterned to form a gate 409 of the thin film transistor and a eleventh portion 610 of the light shielding portion 610, wherein the gate 409 covers at least a side surface of a side, facing the light emitting device, of the active layer 406 and the eleventh portion 610 has at least a portion that extends along a sidewall of the fourth opening 420.

As shown in FIG. 12C, the steps after forming the light shielding portion 610 are the same as those shown in FIG. 10B. For detailed description of the steps, reference may be made to the above description of FIG. 10B, and details are not described herein again.

In an embodiment of the present disclosure, an array substrate and a method for manufacturing the same are provided. The array substrate includes a light shielding portion located between the TFT and the OLED light emitting device, which can effectively prevent light emitted from the light emitting layer of the OLED light emitting device from being irradiated to the active layer of the TFT, thereby preventing deterioration of the TFT.

The foregoing description of the embodiment has been provided for purpose of illustration and description. It is not intended to be exhaustive or to limit the application. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the application, and all such modifications are included within the scope of the application.

What is claimed is:

1. An array substrate comprising:
a substrate;
a thin film transistor located on the substrate;
a light emitting device located on the substrate and spaced apart from the thin film transistor in a direction parallel to a surface of the substrate; and
a light shielding portion located between the thin film transistor and the light emitting device for shielding a light from the light emitting device,
wherein a top surface of the light shielding portion is higher than a top surface of a light emitting layer of the light emitting device,
wherein the light shielding portion is electrically connected to and in contact with a first electrode of the light emitting device,
wherein an orthographic projection of the entire light shielding portion on the substrate does not overlap with an orthographic projection of the light emitting layer of the light emitting device on the substrate,
wherein the light emitting device comprises the first electrode, the light emitting layer, and a second electrode which are sequentially disposed in a direction perpendicular to the surface of the substrate,
wherein the thin film transistor comprises an active layer located on the substrate, a first insulating layer located on the active layer, and a gate located on the first insulating layer, wherein the first insulating layer further covers a surface of the substrate that is not covered by the active layer, wherein the first insulating layer has a second opening, and wherein the light emitting device is located within the second opening,
wherein the array substrate further comprises a third insulating layer located on the gate and the first insulating layer, wherein the third insulating layer has a third opening exposing the light emitting device, and wherein an orthographic projection of the third opening on the substrate is located within an orthographic projection of the second opening on the substrate, and
wherein the light shielding portion comprises a fourth portion extending on a side, away from the substrate and adjacent to the second opening, of the first insulating layer and extending on an edge of the first electrode, wherein the third insulating layer covers a top surface of the fourth portion and a side surface of the fourth portion adjacent to the second opening, and wherein the fourth portion covers a top surface of the first insulating layer, a fifth portion connected to the fourth portion via a second hole in the third insulating layer, a sixth portion extending on a side, away from the substrate, of the third insulating layer adjacent to the third opening and connected to the fifth portion, and a seventh portion connecting the sixth portion to the active layer via a third hole in the first insulating layer and the third insulating layer.

2. The array substrate according to claim 1, wherein the fourth portion of the light shielding portion is disposed in the same layer as the gate.

3. A display device comprising the array substrate according to claim 2.

4. A display device comprising the array substrate according to claim 1.

5. The array substrate according to claim 1, wherein the light shielding portion surrounds the light emitting layer of the light emitting device.

6. A display device comprising the array substrate according to claim 5.

7. The array substrate according to claim 1, wherein the light shielding portion is an electrical connection structure located between one of a source region and a drain region of the thin film transistor and the first electrode of the light emitting device.

8. A display device comprising the array substrate according to claim 7.

9. An array substrate comprising:
a substrate;
a thin film transistor located on the substrate;
a light emitting device located on the substrate and spaced apart from the thin film transistor in a direction parallel to a surface of the substrate; and
a light shielding portion located between the thin film transistor and the light emitting device for shielding a light from the light emitting device,
wherein a top surface of the light shielding portion is higher than a top surface of a light emitting layer of the light emitting device,
wherein an orthographic projection of the entire light shielding portion on the substrate does not overlap with an orthographic projection of the light emitting layer of the light emitting device on the substrate,
wherein the light emitting device comprises the first electrode, the light emitting layer, and a second electrode which are sequentially disposed in a direction perpendicular to the surface of the substrate,
wherein the thin film transistor comprises i) a stacked structure composed of a first source/drain electrode layer, an active layer, and a second source/drain electrode layer which are sequentially disposed in the direction perpendicular to the surface of the substrate, ii) a fourth insulating layer covering the substrate, the stacked structure, and the first electrode, and iii) a gate located on the fourth insulating layer, the gate covering at least a side surface of a side, facing the light emitting device, of the active layer, wherein the first electrode further extends below the first source/drain electrode layer and is in contact with the first source/drain electrode layer,
wherein the fourth insulating layer has a fourth opening exposing the first electrode, and wherein the light emitting layer is located within the fourth opening,
wherein the light shielding portion is located between the first electrode and the fourth insulating layer, and
wherein the light shielding portion comprises an eighth portion located on the first electrode and disposed in the same layer as the first source/drain electrode layer, and a ninth portion located on the eighth portion and disposed in the same layer as the second source/drain electrode layer.

10. The array substrate according to claim 9, wherein the light shielding portion further comprises a tenth portion disposed in the same layer as the gate, wherein the tenth portion is located on the fourth insulating layer and is in contact with the ninth portion via a fourth hole in the fourth insulating layer.

11. An array substrate comprising:
a substrate;
a thin film transistor located on the substrate;
a light emitting device located on the substrate and spaced apart from the thin film transistor in a direction parallel to a surface of the substrate; and
a light shielding portion located between the thin film transistor and the light emitting device for shielding a light from the light emitting device,
wherein a top surface of the light shielding portion is higher than a top surface of a light emitting layer of the light emitting device, and
wherein an orthographic projection of the entire light shielding portion on the substrate does not overlap with an orthographic projection of the light emitting layer of the light emitting device on the substrate,
wherein the light emitting device comprises the first electrode, the light emitting layer, and a second electrode which are sequentially disposed in a direction perpendicular to the surface of the substrate,
wherein the thin film transistor comprises i) a stacked structure composed of a first source/drain electrode layer, an active layer, and a second source/drain electrode layer which are sequentially disposed in the direction perpendicular to the surface of the substrate, ii) a fourth insulating layer covering the substrate, the stacked structure, and the first electrode, and iii) a gate located on the fourth insulating layer, the gate covering at least a side surface of a side, facing the light emitting device, of the active layer, wherein the first electrode further extends below the first source/drain electrode layer and is in contact with the first source/drain electrode layer,
wherein the fourth insulating layer has a fourth opening exposing the first electrode, and wherein the light emitting layer is located within the fourth opening, and
wherein the light shielding portion comprises an eleventh portion disposed in the same layer as the gate, the eleventh portion having at least a portion extending along a sidewall of the fourth opening.

12. A method for manufacturing an array substrate, the method comprising:
providing a substrate;
forming a thin film transistor on the substrate;
forming a light emitting device spaced apart from the thin film transistor on the substrate in a direction parallel to a surface of the substrate; and
forming a light shielding portion for shielding a light from the light emitting device between the thin film transistor and the light emitting device,
wherein a top surface of the light shielding portion is higher than a top surface of a light emitting layer of the light emitting device,
wherein the light shielding portion is electrically connected to and in contact with a first electrode of the light emitting device, and
wherein an orthographic projection of the entire light shielding portion on the substrate does not overlap with an orthographic projection of the light emitting layer of the light emitting device on the substrate,
the method further comprising:
forming an active layer of the thin film transistor on the substrate;
forming a first insulating layer on the substrate and the active layer;
forming a second opening in the first insulating layer;
forming the first electrode in the second opening;
forming a first conductive material layer on the first insulating layer and the first electrode;
patterning the first conductive material layer to form a gate of the thin film transistor and a fourth portion of the light shielding portion, wherein the fourth portion is located on a side, away from the substrate, of the first insulating layer adjacent to the second opening and covers an edge of the first electrode, and wherein the fourth portion covers a top surface of the first insulating layer;
forming a third insulating layer on the first insulating layer and the fourth portion, wherein the third insulating layer covers a top surface of the fourth portion and a side surface of the fourth portion adjacent to the second opening;
patterning the third insulating layer to form a second hole exposing the fourth portion, a third hole exposing the active layer, and a third opening exposing the first electrode in the third insulating layer;
forming a fifth portion, a sixth portion, and a seventh portion of the light shielding portion on the third insulating layer, wherein the fifth portion is connected to the fourth portion via the second hole in the third insulating layer, wherein the sixth portion extends on a side, away from the substrate, of the third insulating layer adjacent to the third opening and is connected to the fifth portion, and wherein the seventh portion connects the sixth portion to the active layer via the third hole in the first insulating layer and the third insulating layer; and
sequentially forming the light emitting layer and a second electrode of the light emitting device on the first electrode.

* * * * *